US008604353B2

(12) United States Patent
Aleksov et al.

(10) Patent No.: US 8,604,353 B2
(45) Date of Patent: Dec. 10, 2013

(54) PACKAGE SUBSTRATE AND DIE SPACER LAYERS HAVING A CERAMIC BACKBONE

(75) Inventors: Aleksandar Aleksov, Chandler, AZ (US); Vladimir Noveski, Chandler, AZ (US); Sujit Sharan, Chandler, AZ (US); Shankar Ganapathysubramanian, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/374,858

(22) Filed: Jan. 19, 2012

(65) Prior Publication Data

US 2012/0152601 A1    Jun. 21, 2012

Related U.S. Application Data

(62) Division of application No. 12/079,785, filed on Mar. 28, 2008, now Pat. No. 8,186,051.

(51) Int. Cl.
| | |
|---|---|
| *H05K 1/03* | (2006.01) |
| *B23K 1/20* | (2006.01) |
| *B23K 31/02* | (2006.01) |
| *B05D 5/12* | (2006.01) |
| *B05D 3/00* | (2006.01) |

(52) U.S. Cl.
USPC ............................ 174/258; 427/123; 228/203

(58) Field of Classification Search
CPC ............ H05K 1/03; B23K 1/20; B23K 31/02; B05D 5/12; B05D 3/00
USPC .............................. 174/258; 427/123; 228/203
See application file for complete search history.

(56) References Cited

U.S. PATENT DOCUMENTS

| | | | |
|---|---|---|---|
| 6,187,418 B1 * | 2/2001 | Fasano et al. | 428/210 |
| 6,228,754 B1 | 5/2001 | Iacoponi et al. | |
| 6,316,168 B1 | 11/2001 | Butt et al. | |
| 6,392,301 B1 | 5/2002 | Waizman et al. | |
| 6,753,613 B2 | 6/2004 | Levardo et al. | |
| 6,768,206 B2 | 7/2004 | Hosomi | |
| 6,943,294 B2 | 9/2005 | Kang et al. | |
| 6,975,025 B2 | 12/2005 | LeBonheur et al. | |
| 7,523,545 B2 * | 4/2009 | Kumar et al. | 29/830 |
| 7,964,972 B2 | 6/2011 | Matsui | |
| 2002/0031642 A1 * | 3/2002 | Ritland et al. | 428/117 |
| 2005/0276934 A1 * | 12/2005 | Fukui et al. | 428/32.6 |
| 2008/0176732 A1 * | 7/2008 | Loh et al. | 501/32 |
| 2008/0220155 A1 * | 9/2008 | Yoshizumi et al. | 427/117 |
| 2008/0237718 A1 | 10/2008 | Noveski et al. | |
| 2009/0179310 A1 * | 7/2009 | Dunton et al. | 257/656 |
| 2009/0242247 A1 | 10/2009 | Aleksov et al. | |
| 2011/0041330 A1 * | 2/2011 | Kumar et al. | 29/830 |

OTHER PUBLICATIONS

Beyer, Volker, et al., "Flexible Polyimide Interposer for CSP Preparation," IEEE, Feb. 1998, pp. 112-115.
Hara, Kazumi, et al., "Enabling Technologies for 3-D Integration," Enabling Technologies for 3-D Integration Symposium, Boston, MA, USA, Nov. 27-29, 2006, pp. 133-143.

(Continued)

*Primary Examiner* — Timothy Thompson
*Assistant Examiner* — Charles Pizzuto
(74) *Attorney, Agent, or Firm* — Zea, Barlocci & Markvardsen

(57) ABSTRACT

A layer or layers for use in package substrates and die spacers are described. The layer or layers include a plurality of ceramic wells lying within a plane and separated by metallic vias. Recesses within the ceramic wells are occupied by a dielectric filler material.

16 Claims, 4 Drawing Sheets

(56) References Cited

OTHER PUBLICATIONS

Kikuchi, Katsuya, et al., "10-Gbps Signal Propagation of High-Density Wiring Interposer Using Photosensitive Polyimide for 3D Packaging," IEEE 2006 Electronic Components and Technology Conference, Jun. 2006, pp. 1294-1299.

Kurita, Yoichiro, et al., "A 3D Stacked Memory Integrated on a Logic Device Using SMAFTI Technology," 2007 Electronic Components and Technology Conference, Mar. 2007, pp. 821-829.

Marinis, Thomas F., et al., "Isolation of MEMS Devices from Package Stresses by Use of Compliant Metal Interposers," IEEE 2006 Electronic Components and Technology Conference, Jun. 2006, pp. 1108-1117.

Master, Raj N., et al., "Solder Column Interposer for Single Chip Ceramic Packaging," 1999 Electronic Components and Technology Conference, Sep. 1999, pp. 426-429.

Nieweglowski, et al., "Ceramic Interposer for Optoelectronic Array Devices," ISSE St. Marienthal, Germany, Mar. 2006, pp. 68-73.

\* cited by examiner

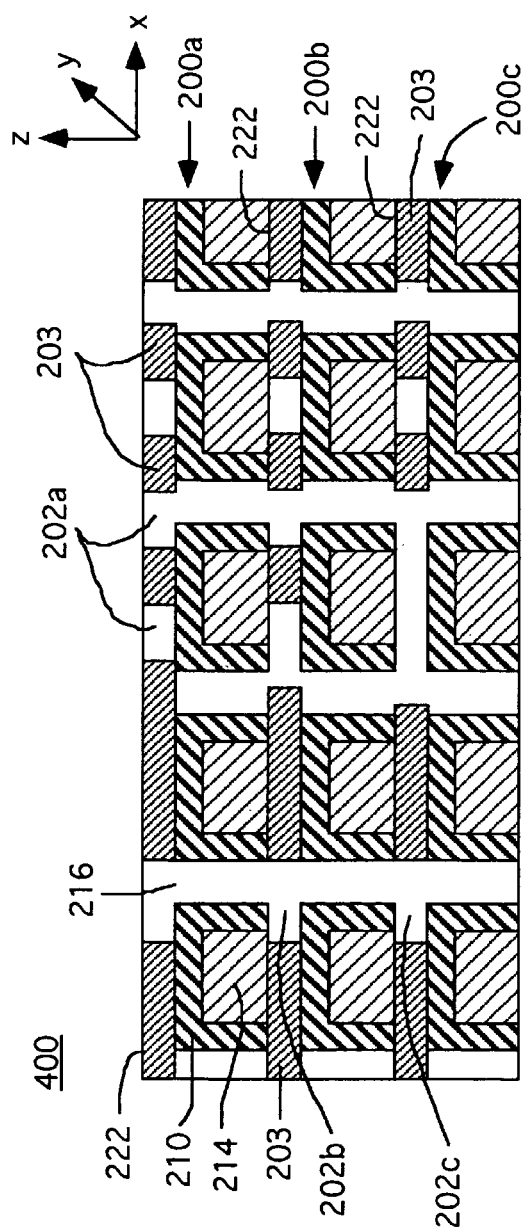

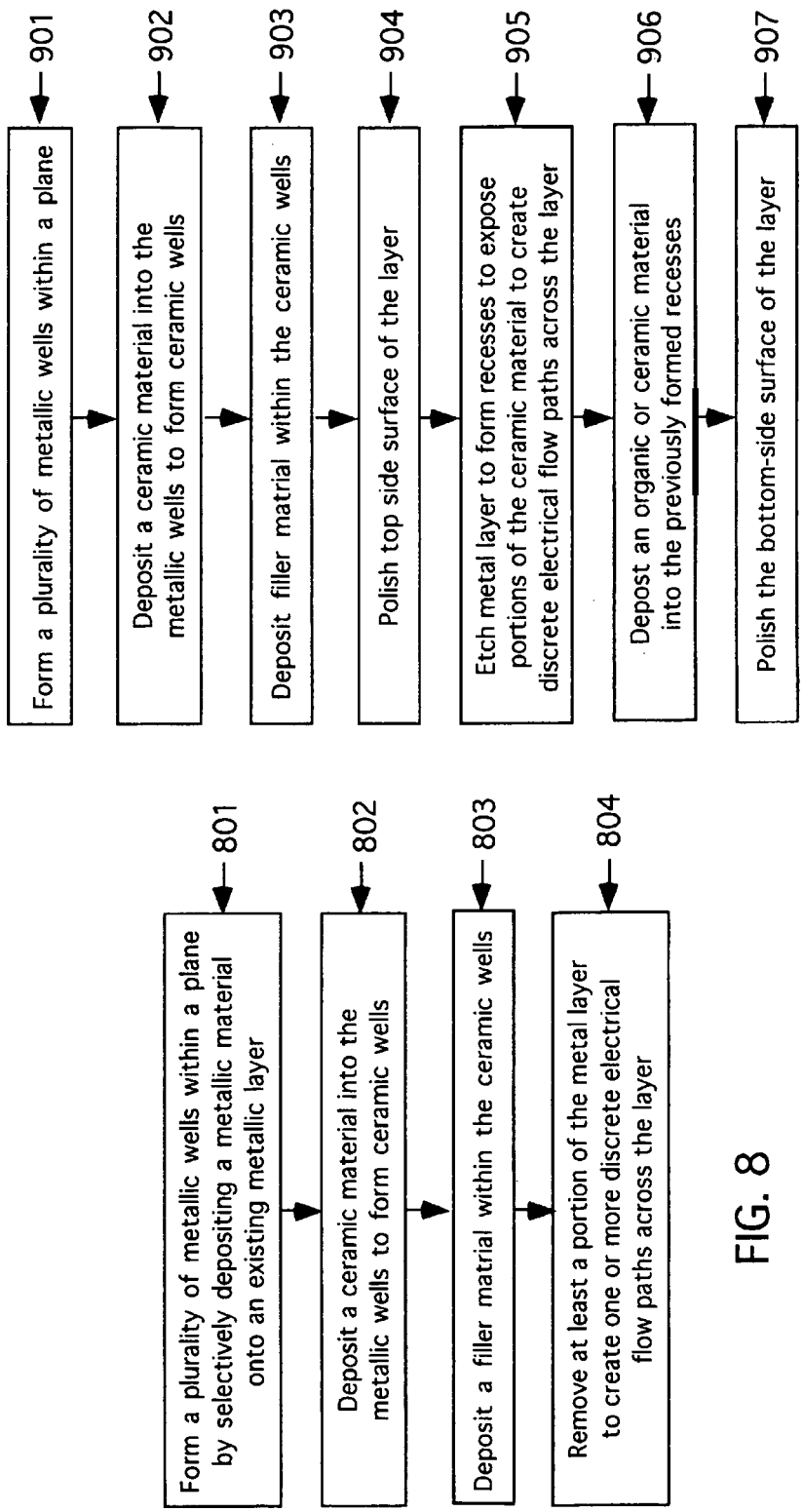

PACKAGE SUBSTRATE AND DIE SPACER LAYERS HAVING A CERAMIC BACKBONE

The present application is a divisional application of co-pending patent application Ser. No. 12/079,785, filed on Mar. 28, 2008, which is entitled "METHODS FOR FABRICATING PACKAGE SUBSTRATE AND DIE SPACER LAYERS HAVING A CERAMIC BACKBONE".

BACKGROUND

Semiconductor dies are routinely connected to larger circuit boards such as motherboards and other types of printed circuit boards (PCBs). Connection is made by use of a circuit substrate that has two sets of connection points, a set for connection to the die and a less densely-packed for connection to the PCB. The circuit substrate generally consists of an alternating sequence of a plurality of organic insulation layers and a plurality of patterned electrically conductive layers forming traces between the insulation layers. Electrically conductive vias—e.g., plated vias having organic cores—extending through the insulation layers electrically interconnect the conductive layers. A substrate core having thicker insulation and conductive layers is typically provided to provide sufficient rigidity to the substrate. Similar, yet simpler, structures known as die spacers are used to interconnect stacked semiconductor dies.

Continued advancements in integrated circuit technology have resulted in the need for substrates having higher electrical performance, higher routing density and greater heat spreading capability. The existing substrate architecture has several drawbacks, the primary problem being the mechanical and thermal characteristics of the organic insulation layers. For example, reduction of substrate z-height is hindered by the relative flexibility of the organic layers that require the use of a thick core structure. In addition, the low thermal conductivity of the organic insulation layers combined with the low metal density of the substrate limit the substrate's heat spreading capability. Moreover, the large mismatch between the thermal expansion coefficients (CTE) of the organic insulation and conductive layers induce stresses within the substrate that can cause warping and/or circuit fractures.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIG. 4 illustrates layers in a package substrate or die spacer in another embodiment of the invention.

FIG. 5 illustrates layers in a package substrate or die spacer in yet another embodiment of the invention.

FIG. 8 is a flowchart of a process for fabricating a package substrate or die spacer layer in one embodiment of the present invention.

FIG. 9 is a flowchart of a process for fabricating a package substrate or die spacer layer in another embodiment of the present invention.

DETAILED DESCRIPTION OF THE PRESENT INVENTION

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In accordance with the present invention a composite layer or layers for use in integrated circuit packages and/or die spacers is provided in addition to methods for manufacturing the same. The composite layers of the present invention have high metal densities as compared to existing package substrate and die spacer architectures and make use of an electrical insulating ceramic having a high degree of stiffness as a backbone structure of the layers. The mechanical stability and thermal conductivity provided by the ceramic material in combination with the high metal density permits the use of thinner layers and the omission of thick core layers without compromising electrical performance or mechanical stability, thus enabling an overall reduction in the z-height of the package substrate and/or die spacer. The design also allows for better current carrying capability since the interconnects extending through the layers are bulk metal and not just edge plating. In addition, the use of bulk metal interconnects allows for pitch and size reduction without adversely impacting manufacturing costs. The heat spreading capability of the composite layers and the end product substrates constructed from the composite layers is also enhanced due to the high metal density of the layers and by the thermal conductivity of the ceramic backbone structures. Moreover, the thermal expansion coefficients (CTE) of the ceramic and metal materials can be more closely matched to minimize induced stresses within the substrate. The combined thermal expansion coefficient of the substrates can also be matched more closely with the thermal expansion coefficient of an attached die to minimize stresses imparted by the substrate to the die. A further advantage of the design is the ability to use more aggressive solvents during the manufacturing process as compared to those used in the manufacture of conventional glass fiber/epoxy composite layers.

Figure 2:
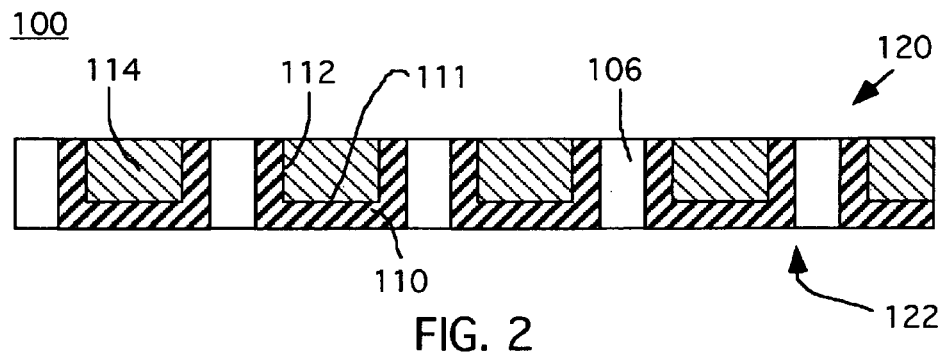
FIG. 2 illustrates a layer for use in a package substrate or die spacer in an embodiment of the present invention.

FIG. 2 illustrates an example of a composite layer 100 for use in an integrated circuit package substrate and/or die spacer in one embodiment of the present invention. Layer 100 includes a ceramic backbone structure in the form of a plurality of spaced-apart ceramic wells 110 located within a plane. Each of the ceramic wells 110 typically has a bottom wall portion 111 and a sidewall portion 112. An electrically conductive material 106 disposed between the ceramic wells 110 provide electrical flow paths between the topside surface 120 and bottom-side surface 122 of the composite layer 100. A filler material 114, such as a dielectric material, is located within the ceramic wells 110 to eliminate voids and to permit the planarization of the topside surface 120. Note also that the ceramic wells 110 may take many forms and are not limited to the U-shaped configuration shown in the drawings.

FIG. 8 is a flow chart of the general process for fabricating the composite layer 100 in accordance with one embodiment of the present invention. Beginning at block 801 a plurality of metallic wells is formed within a plane by depositing a metallic material onto an existing base metal layer. Ceramic wells are then formed by depositing a ceramic material into the previously formed metallic wells (Block 802). A filler material is then deposited within the recesses of the ceramic wells (Block 803). Discrete electrical flow paths are then created by removing all or a portion of the base metal layer (Block 804).

Figure 1:
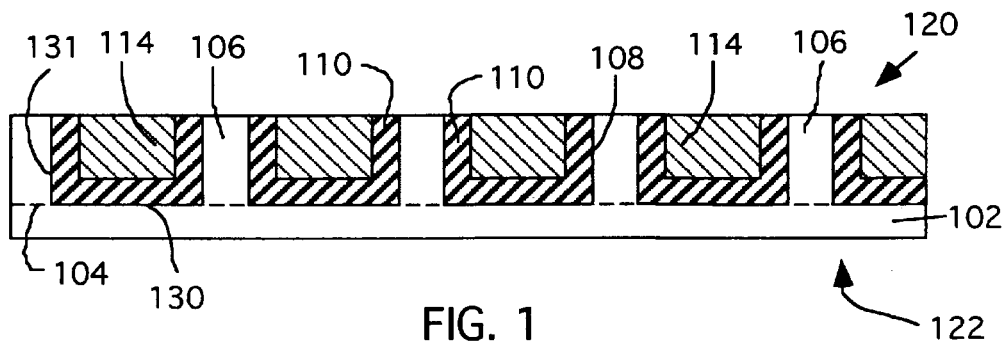
FIG. 1 illustrates a layer for use in a package substrate or die spacer in an embodiment of the present invention prior to etching the base metal layer.

More specifically, formation of composite layer 100 can be accomplished by any of a number of manufacturing methods and process steps and is particularly suited for formation using conventional lithography techniques. In accordance with one method, layer 100 is fabricated by first masking the top surface 104 of a base metal layer 102 and depositing a metal material 106 within the openings of the mask onto the metal layer 102. The mask is then removed to form metallic wells having bottom wall portions 130 and sidewall portions 131 as shown in FIG. 1. In one embodiment, the base metal layer 102 and deposited metal material 106 is copper, each having thicknesses between about 10.0 microns to about 100.0 microns. Other materials such as gold, aluminium, silver may also be used. Any of a variety of deposition methods may be used to deposit the metal material 106, such as, for example, electroplating, sputtering and evaporation methods. After the metallic wells are formed an electrically insulating ceramic having a high degree of stiffness is deposited onto the bottom wall portions 130 and sidewall portions 131 of the metallic wells to create the ceramic wells 110. In one embodiment a blanket film of the insulating ceramic is deposited onto the exposed surfaces to form the wells. Any excess material is later removed when the topside surface 120 of layer 100 is planarized using a mechanical or chemical-mechanical polishing method, as discussed below. In an alternative embodiment the ceramic wells are formed by positioning a second mask having openings above the metallic wells and depositing the ceramic through the openings onto the bottom wall portions 130 and sidewall portions 131 of the metallic wells. Examples of ceramic materials suitable for use within layer 100 are polycrystalline diamond, diamond-like carbon (DLC), aluminium nitrides, aluminium oxides, aluminium phosphides and silicon carbides. In one embodiment, the ceramic material is sputter deposited to a thickness of between about 10.0 microns to about 100.0 microns.

To improve adhesion between the metal and ceramic materials an adhesion layer 108 having a thickness of between about 1.0 to about 10.0 microns may be deposited or otherwise formed on the bottom wall portions 130 and side wall portions 131 of the metallic wells prior to depositing the ceramic material. The adhesion layer may include any of a number of materials including tungsten, titanium, cobalt, iron and nickel that are electroplated, sputtered or evaporated onto the metallic well wall portions. An alternative process for enhancing adhesion between the ceramic and metal materials is to seed the metallic well wall portions 130 and 131 with nano-particles or micro-particles. The nano-particles or micro-particles can be metals, ceramics or a combination thereof in nano/micro composite form. In one process the nano-particles or micro-particles are dispersed in a solution such as water or an organic liquid and deposited onto the metallic wall portions 130 and 131 by a spinning or immersion process. Adhesion of the nano/micro particles onto the wall portions 130 and 131 is accomplished by evaporating the solution in which the particles are suspended. Adhesion of the nano/micro particles onto wall portions 130 and 131 may be enhanced by use of ultrasound during the spinning or immersion process.

Figure 3:
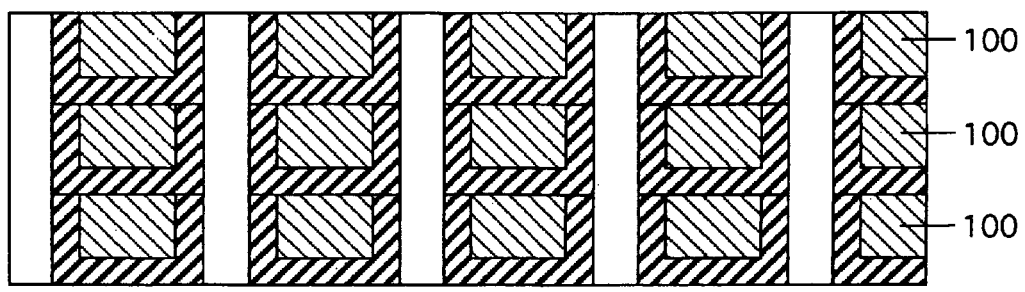
FIG. 3 illustrates layers in a package substrate or die spacer in an embodiment of the invention.

After the ceramic wells 110 have been formed, the ceramic well recesses are filled with a filler material 114, such as an epoxy or a ceramic (e.g., spun glass). The filler material may be deposited within the ceramic wells with or without the use of a mask. In any event, after depositing the filler material 114 the topside surface 120 of layer 100 is planarized using a mechanical or chemical-mechanical polishing method. As a final step, all or a portion of the base metal layer 102 is removed by an etching process to create discrete electrical flow paths that extend between the topside surface 120 and backside surface 122 of layer 100. After etching of the base metal layer 102, the backside surface 122 is planarized using a mechanical or chemical-mechanical polishing process. When only portions of the base metal layer 102 are etched to create traces on the backside surface 122 of the layer, an epoxy or a ceramic material is deposited between the traces before the polishing the backside surface 122. FIG. 2 represents a layer 100 where the entire base metal layer 102 has been removed. A basic use of layer 100 may be a single layer die spacer. Note that lands or other suitable connection points may need to be incorporated into the topside and backside surfaces 120 and 122 of layer 100 to facilitate attachment of the layer 100 to the integrated circuits. As shown in FIG. 3, thicker die spacers 300 may be fabricated by stacking multiple composite layers 100. As will be described in more detail below, layer 100 may also be used as a building block for forming more complex circuits for use in integrated circuit package substrates or die spacers.

FIG. 4 illustrates a substrate 400 in an integrated circuit package substrate or die spacer consisting of a plurality of stacked composite layers 200a, 200b and 200c. Although three composite layers are shown, it is appreciated that substrate 400 may have fewer than or greater than three layers. Composite layers 200a, 200b and 200c are of generally the same construction as layer 100 described above except that the base metal layers 202a, 202b and 202c have been selectively etched to create more complex three-dimensional electrical flow paths that run through and across the substrate 400. Each of layers 200 include ceramic wells 210 with a filler material 214 occupying the well recesses. As shown in FIG. 4, base metal layers 202a, 202b and 202c have been selectively etched to create traces in the backside surface 222 of each layer, the traces lying within the x-y plane. The traces are patterned using a photolithography method that includes selective removal of portions of layers 202a, 202b and 202c and the subsequent deposition of an insulating epoxy or ceramic material (e.g., spun glass) 203 between the traces. The use of a ceramic material has the advantage of reducing CTE mismatch within the layer. The traces are interconnected between layers in the z-direction by the conductive vias 216 positioned between the ceramic wells 210.

FIG. 9 is a flow chart of a process for fabricating either one of composite layers 200a, 200b and 200c in accordance with one embodiment of the present invention. Beginning at block 901 a plurality of metallic wells is formed within a plane by depositing a metallic material onto an existing base metal layer. Ceramic wells are then formed by depositing a ceramic material into the previously formed metallic wells (Block 902). A filler material is then deposited within the recesses of the ceramic wells and the topside surface of the layer is polished (Blocks 903 and 904). Portions of the of the base metal layer are then removed to create traces in the backside surface of the layer (Block 905). After depositing an insulating material, such as an organic material or ceramic between the traces the backside surface 222 is planarized using a mechanical or chemical-mechanical polishing process (Blocks 906 and 907).

Figure 6:
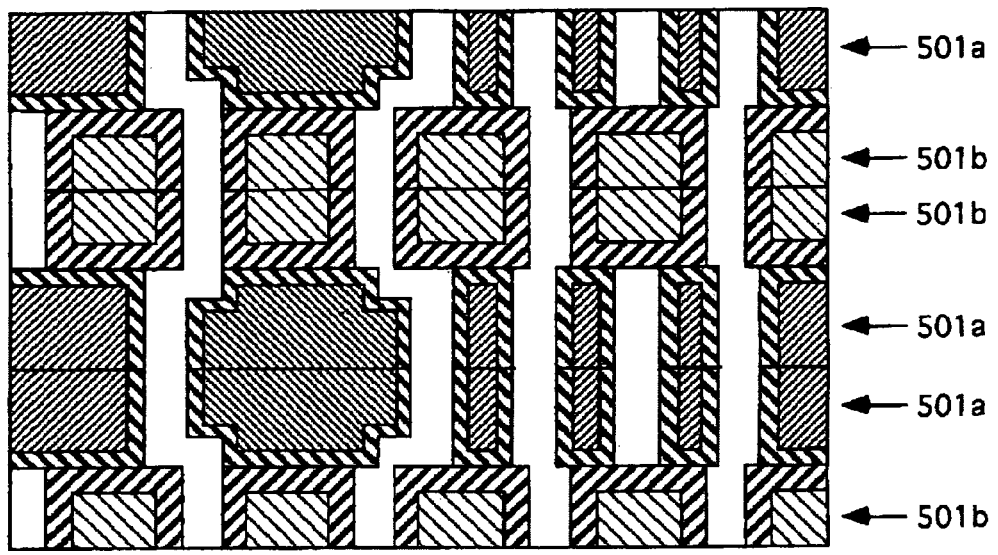
FIG. 6 illustrates layers in a package substrate or die spacer in an embodiment of the invention.

An advantage of the present invention is the ability to design and construct "off the shelf" composite layers that can be arranged and stacked to create a variety three-dimensional circuits. FIGS. 5 and 6 illustrate an example where two composite layer designs 501a and 501b are used to create substrates with different circuit structures. As shown in FIG. 5, each of layers 501a and 501b include ceramic wells (510a and 510b) with electrically conductive bulk metal regions 506a and 506b dispersed between the ceramic wells. As described above in conjunction with FIGS. 1 and 2, the recesses of ceramic wells 510a and 510b contain filler materials 514a and 514b which typically comprise an epoxy or other ceramic material. As illustrated in FIG. 5, a circuit is created within substrate 500 by the stacking of the two layers 501a and 501b. FIG. 6 illustrates a substrate 600 having a more complex circuit structure that is constructed by using a combination of layers 501a and 501b. As shown, the more complex circuit structure is achieved by stacking and inverting the combination of layers 501a and 501b. The circuit structure of substrate 600 may be further altered by off-setting the ceramic wells and bulk metal features in adjacent layers. Further alterations may be achieved by the inclusion of one or more additional layers into the substrate that are different from layers 501a and 501b.

Figure 7:
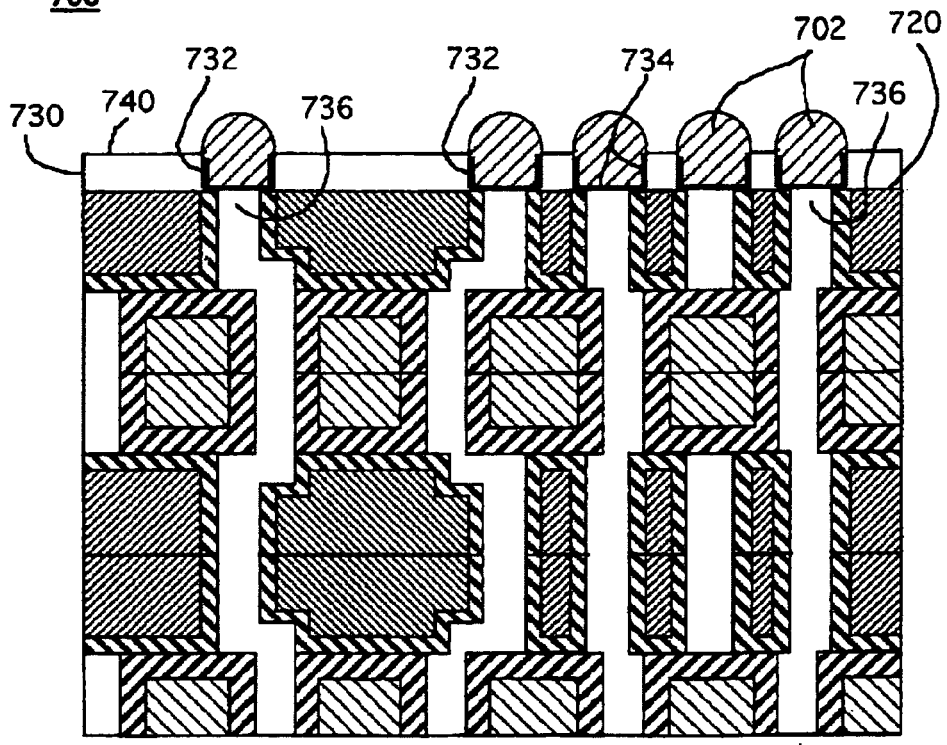
FIG. 7 illustrates a package substrate or die spacer in an embodiment of the invention.

A substrate constructed in accordance with the teachings of the present invention for use in package substrates may include additional features in the form of lands, solder bumps, pins, or other suitable connection points to facilitate attachment of the substrate to external devices such as integrated circuit chips, printed circuit boards (PCB), or the like. FIG. 7 illustrates the substrate 600 of FIG. 6 having solder bumps 702 formed on a top surface 720 thereof for interconnecting the substrate to an integrated circuit die (not shown). Formation of the solder bumps 702 is accomplished by first applying a surface resist layer 730 to the top surface 720 of substrate 600. In one embodiment, the thickness of the surface resist layer is between about 0.5 micrometers to about 30 micrometers. Using conventional photolithography methods, openings 732 are formed within the surface resist layer 730 to expose the metallic regions 736 on the top surface 720 of substrate 600. The diameter of openings 732 may vary significantly between the alternative substrates that may be manufactured using the composite layers and methodologies of the present invention. In one embodiment the diameter of openings 732 is between about 5 micrometers to about 200 micrometers.

In one embodiment, prior to forming solder bumps 702, a surface finish metallization 734 is applied to the exposed metallic regions 736, and optionally to the side walls of openings 732. The surface finish metallization may comprise any of a variety of metal layers such as electroless nickel-gold layers, nickel/palladium/gold layers or an iron with an additional capping metal such as plated tin or solder. The surface finish metallization 734 enhances adhesion of the solder to the surface resist 730 and exposed metal regions 736 and also acts as a diffusion barrier and oxidation barrier to inhibit or slow the formation of intermetallics.

The solder bumps 702 are formed by masking the top surface 740 of the surface resist layer 730 to expose only the openings 732 and subsequently depositing a solder material into the openings. The final height of the solder bumps 702 above the top surface 740 of the surface resist layer 730 is generally in the range of between about 5 micrometers to about 75 micrometers. Any of a variety of solders may be used to form solder bumps 702. Examples include, but are not limited to tin/silver, tin/silver/copper and tin/copper based solders.

An alternative to forming solder bumps 702 includes depositing a metal within the openings 732 of the surface resist layer 730 to create conductive vias between the exposed metal regions 736 on the top surface 720 of substrate 600 and the top surface 740 of surface resist layer 730. In one embodiment, the metal forming the conductive vas is similar or identical to the bulk metal used to form the circuits within substrate 600. After the conductive vias are formed, the solder bumps 702 can be formed by any number of methods such as paste printing, plating, etc.

Although not shown in FIG. 7, the backside surface 750 of substrate 600 will include second-level interconnect features for connecting the substrate 600 to a PCB, such as a motherboard or other external device. The second-level interconnects may include lands, metallic bumps, pins, solder balls or any other suitable connection points to facilitate attachment of the substrate to external devices.

Other embodiments of the invention will be appreciated by those skilled in the art from consideration of the specification and practice of the invention. Furthermore, certain terminology has been used for the purpose of descriptive clarity, and not to limit the present invention. The embodiments and preferred features described above should be considered exemplary, with the invention being defined by the appended claims.

What is claimed is:

1. An integrated circuit package substrate comprising:
a composite layer having an upper surface and a lower surface, the composite layer comprising a plurality of spaced-apart ceramic wells lying within a plane with at least some of the ceramic wells being separated by metallic vias that extend between the upper and lower surfaces;
a filler material disposed within at least some of the ceramic wells;
and an adhesion or seed layer disposed between the filler material and the ceramic wells.

2. The integrated circuit package substrate of claim 1 wherein the ceramic material is selected from the group consisting of: polycrystalline diamond, diamond-like carbon (DLC), aluminium phosphides and silicon carbides.

3. The integrated circuit package substrate of claim 1 wherein the metallic vias comprise copper.

4. The integrated circuit package substrate of claim 1 wherein the metallic vias comprise aluminium.

5. The integrated circuit package substrate of claim 1 wherein the metallic vias comprise gold.

6. The integrated circuit package substrate of claim 1 wherein the filler material comprises a dielectric material.

7. The integrated circuit package substrate of claim 1 comprising a plurality of stacked composite layers.

8. The integrated circuit package substrate of claim 7 wherein at least some of the metallic vias in the plurality of stacked composite layers are arranged to provide an electrical flow path between a topside surface and a bottom-side surface of the integrated circuit package substrate.

9. A die spacer comprising:
a composite layer having an upper surface and a lower surface, the composite, layer comprising a plurality of spaced-apart ceramic wells lying within a plane with at least some of the ceramic wells being separated by metallic vias that extend between the upper and lower surfaces;

a filler material disposed within at least some of the ceramic wells;

and an adhesion or seed layer disposed between the filler material and the ceramic wells.

10. The die spacer of claim 9 wherein the ceramic material is selected from the group consisting of: polycrystalline diamond, diamond-like carbon (DLC), aluminium phosphides and silicon carbides.

11. The die spacer of claim 9 wherein the metallic vias comprise copper.

12. The die spacer of claim 9 wherein the metallic vias comprise aluminium.

13. The die spacer of claim 9 wherein the metallic vias comprise gold.

14. The die spacer of claim 9 wherein the filler material comprises a dielectric material.

15. The die spacer of claim 9 comprising a plurality of stacked composite layers.

16. The die spacer of claim 15 wherein at least some of the metallic vias in the plurality of stacked composite layers are arranged to provide an electrical flow path between a topside surface and a bottom-side surface of the die spacer.

* * * * *

UNITED STATES PATENT AND TRADEMARK OFFICE
CERTIFICATE OF CORRECTION

PATENT NO. : 8,604,353 B2  Page 1 of 1
APPLICATION NO. : 13/374858
DATED : December 10, 2013
INVENTOR(S) : Aleksov et al.

It is certified that error appears in the above-identified patent and that said Letters Patent is hereby corrected as shown below:

In the Specification

Column 6, at line 9 delete, "vas" and insert -- vias --.

Signed and Sealed this
Fifteenth Day of April, 2014

Michelle K. Lee
*Deputy Director of the United States Patent and Trademark Office*